United States Patent [19]
Lopata

[11] Patent Number: 6,163,285
[45] Date of Patent: Dec. 19, 2000

[54] METHOD OF DIRECT CURRENT OFFSET CANCELLATION

[75] Inventor: Douglas D. Lopata, Boyertown, Pa.

[73] Assignee: Lucent Technologies, Inc., Murray Hill, N.J.

[21] Appl. No.: 09/179,779

[22] Filed: Oct. 27, 1998

[51] Int. Cl.$^7$ ...................................................... H03M 1/48
[52] U.S. Cl. ............................................................ 341/118
[58] Field of Search ............................................. 341/118

[56] References Cited

U.S. PATENT DOCUMENTS

| | | | |
|---|---|---|---|
| 4,972,189 | 11/1990 | Polito et al. | 341/118 |
| 5,053,770 | 10/1991 | Mayer et al. | 341/118 |
| 5,371,552 | 12/1994 | Brummette et al. | 341/118 |

*Primary Examiner*—Trong Phan
*Attorney, Agent, or Firm*—Schnader, Harrison, Segal & Lewis

[57] ABSTRACT

The present invention is directed to a system for correcting a voltage offset in a circuit by amplifying an input voltage to produce an amplified voltage; sampling an offset voltage present in the amplified voltage during a sampling mode; subtracting a value of the offset voltage from the amplified voltage during a correction mode; producing an output voltage; adding a feedback voltage to the input voltage based upon the output voltage; and maintaining the output voltage at substantially the same voltage during the sampling mode and the correction mode. This can be accomplished in an integrated circuit which includes an amplification circuit having an input and an output, wherein the input is connected to receive an input voltage and to produce an amplified voltage; a sampling circuit connected to the output of the amplification circuit, the sampling circuit being capable of sampling an offset voltage in the amplified voltage during a sampling mode and subtracting a value of the offset voltage from the amplified voltage during a correction mode, and producing an output voltage at an output; and a feedback circuit continuously connected to the output of the sampling circuit and the input of the amplification circuit for adding a feedback voltage to the input voltage based upon the output voltage; wherein the output voltage at the output of the sampling circuit is substantially the same during the sampling mode and the correction mode.

18 Claims, 4 Drawing Sheets

METHOD OF DIRECT CURRENT OFFSET CANCELLATION

BACKGROUND OF THE INVENTION

1. Field of the Invention

The invention relates to analog feedback amplifier circuits which require DC offset correction, and in particular to analog feedback amplifier circuits used to accomplish offset correction while conserving the dynamic range of the signal to be amplified.

2. Description of the Prior Art

DC offset in an analog signal is an often unwanted artifact of component mismatch or other phenomena. DC offset can impair the dynamic range and the integrity of the signal to be amplified.

Correlated double sampling (CDS) is a technique often used to correct for DC offset. In a system using CDS, the amount of DC offset is calculated, stored, and subtracted from the signal before amplification. The DC offset is calculated during an inactive time for the amplifier—when the signal input to the amplifier indicates that the amplifier should not be generating an output.

Under the assumption that the DC offset of the signal during this inactive time is equal to the DC offset during an active time for amplification, the DC offset is calculated during the inactive time. The DC offset calculated is then stored and subtracted from the signal during active periods for the amplifier.

There are various ways to implement CDS, which are known in the prior art. If the analog signal is converted to a digital signal somewhere in the signal path, the sampling of the DC offset can occur in the digital domain and the offset may be stored in one or more digital registers. The benefit of this implementation of CDS is that a digital register provides lasting, stable storage for the DC offset value to be subtracted from the signal.

This implementation has the distinct disadvantage, however, that subtraction only will happen in the digital domain, and therefore dynamic range can be lost in the signal before its conversion to a digital signal. Also, this technique is limited to circuits which include an A/D converter somewhere in the signal path, or requires the addition of an A/D converter solely for this purpose. Moreover, if the system is subject to drifting DC offsets (because of temperature or gain changes, for example) the DC offset stored may not correspond to the actual DC offset after some period of operation.

A variation of this implementation is to convert the DC offset stored in the digital register to an analog value (through a D/A converter) and to subtract this analog value from the signal before it enters the digital domain (and before dynamic range is lost in the analog domain). This solves the problem of lost dynamic range in the analog domain, however the other two problems (limitation to those systems employing conversion to a digital signal and problems due to DC offset drift) are not remedied.

An implementation of CDS that does not require conversion to the digital domain is implemented by calculating the DC offset in the analog domain and storing it in a sample-hold amplifier. This implementation usually involves storing a voltage on a capacitor which corresponds to the amount of DC offset required. It is not necessary that the sample-hold amplifier be a second amplifier in the circuit, a second input stage to the existing amplifier in the circuit may be added instead, and this second input stage, again in conjunction with a capacitor storing a voltage corresponding to DC offset, takes the place of the second amplifier.

However, this implementation has the significant disadvantages that capacitor storage of a voltage corresponding to the DC offset is subject to leakage and is therefore not permanent. Moreover, the prior art circuits used for this implementation often cause outputs of the channel to be corrupted during DC offset cancellation, which may lead to complex timing issues between successive stages needing DC offset correction. This is an especially important issue when offset correction must occur simultaneously across partitioning boundaries in an application.

SUMMARY OF THE INVENTION

The present invention is directed to a system for correcting a voltage offset in a circuit by amplifying an input voltage to produce an amplified voltage; sampling an offset voltage present in the amplified voltage during a sampling mode; subtracting a value of the offset voltage from the amplified voltage during a correction mode; producing an output voltage; adding a feedback voltage to the input voltage based upon the output voltage; and maintaining the output voltage at substantially the same voltage during the sampling mode and the correction mode.

This can be accomplished in an integrated circuit which includes an amplification circuit having an input and an output, wherein the input is connected to receive an input voltage and to produce an amplified voltage; a sampling circuit connected to the output of the amplification circuit, the sampling circuit being capable of sampling an offset voltage in the amplified voltage during a sampling mode and subtracting a value of the offset voltage from the amplified voltage during a correction mode, and producing an output voltage at an output; and a feedback circuit continuously connected to the output of the sampling circuit and the input of the amplification circuit for adding a feedback voltage to the input voltage based upon the output voltage; wherein the output voltage at the output of the sampling circuit is substantially the same during the sampling mode and the correction mode.

DETAILED DESCRIPTION

The present invention will be understood more fully from the detailed description given below and from accompanying drawings of preferred embodiments of the invention, which, however, should not be taken to limit the invention to a specific embodiment, but are for explanation and understanding only.

The present invention is directed to an analog DC offset correction technique which eliminates output data corruption that occurs with prior art circuit configurations for DC offset correction. The invention eliminates the many of the problems associated with having a DC offset sampling mode during which the voltage output from the amplifier is different from the voltage output from the amplifier during normal operation (when the circuit is in corrected mode).

This may be accomplished in the present invention by inserting a second amplifier in parallel with the first amplifier requiring DC offset correction. Instead of disconnecting the first amplifier from its feedback components as in the prior art, a preferred embodiment of the present invention provides a second amplifier with inputs connected to the outputs of the first amplifier during sampling. The second amplifier has much higher transconductance/effective gain which dominates the first amplifier, driving its outputs to zero during the DC offset sampling.

During sampling, the second amplifier outputs to a storage element which stores a charge correlated with the DC offset to be applied to the signal. When the sampling period is over, the inputs to the second amplifier are disconnected from the outputs of the first amplifier, and the charge stored in the capacitor is used to correct for the DC offset of the signal. Another embodiment of the present invention works in a similar fashion, utilizing a second input stage to the first amplifier in place of the second amplifier described above.

Figure 2:
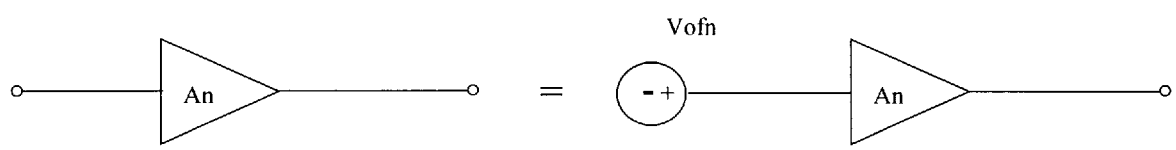
FIG. 2 is a diagram of an ideal amplifier circuit.

A diagram of an ideal amplifier is shown in FIG. 2. An input signal applied to an amplifier stage having gain An multiplies the input voltage by that gain factor to produce an output voltage Vout which is equal to Vin×An. No DC offset is present. Since DC offset of some Voltage Vofn occurs in real systems, a subtracting voltage source of voltage–Vofn is placed in series (added) with voltage Vin prior to being inputted into amplifier stage An.

Figure 1:
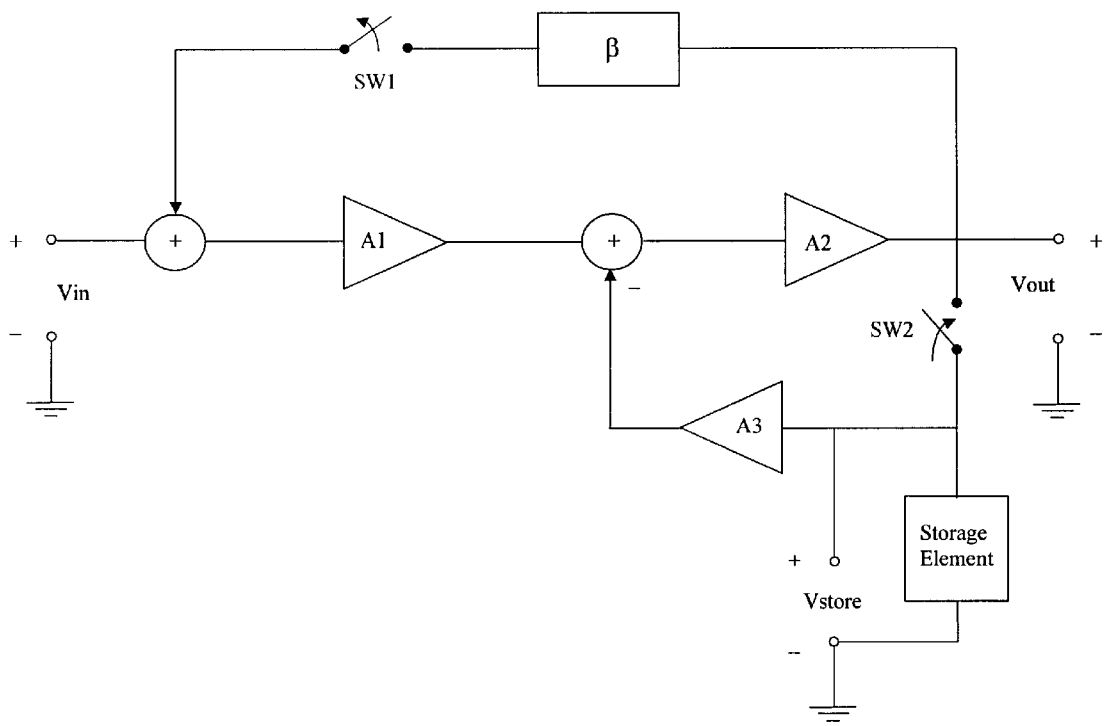
FIG. 1 is a control system diagram of an offset correction circuit of the prior art.

An example of the standard multiple stage offset store mode circuit of the prior art used to approximate the ideal amplifier is shown in FIG. 1. An input voltage Vin is applied to the input of amplifier stage A1. The output of amplifier stage A1 is in turn applied to the input of amplifier stage A2. The output of amplifier stage A2 is connected across switch SW2 to a Storage Element. The amplifier stages A1 and A2 are not limited and can be any number of voltage gain circuits well known to those of skill in the art. The Storage Element may be any number of well known energy storage mechanisms, such as storage capacitors with associated circuitry and the like.

The voltage from the Storage Element, Vstore, is inputted to conventional inversion stage A3, which inverts Vstore for addition (subtraction) with the output from amplifier stage A1 prior to its being inputted to amplifier stage A2, as will be described in more detail below.

The output from amplifier stage A2 is also inputted to conventional closed loop gain feedback circuit β. The output of feedback circuit β is connected across switch SW1 to be added to Vin prior to its being inputted to amplifier stage A1.

The circuit shown in FIG. 1 operates as follows. With switch SW1 opened and switch SW2 closed (sampling mode), the output from amplifier stage A2 is used to sample and hold the output voltage Vout by charging the Storage Element in a conventional manner until Vstore equals Vout (the output voltage from amplifier A2). When switch SW1 is closed and switch SW2 is open (correction mode), inversion stage A3 subtracts Vstore from the output of amplifier stage A1, which is inputted to amplifier stage A2, theoretically correcting the DC voltage offset.

When switch SW1 is open and switch SW2 is closed, the operation of the circuit of FIG. 1 is represented in the following Equation 1, where each of A1, A2, and A3 is the gain of amplifier stage A1, amplifier stage A2 and inversion stage A3, respectively, and Vof1, Vof2, and Vof3 are the offset voltages of each of these stages.

$$V_{store} = V_{out} = \frac{A_1 A_2 (V_{of1} + V_{in}) + A_2 V_{of2} - A_2 A_3 V_{of3}}{1 + A_2 A_3}$$

When $A_2 A_3 >> 1$, the circuit of FIG. 1 can be represented by the following Equation 2:

$$V_{store} = \frac{A_1}{A_3}(V_{of1} + V_{in}) + \frac{V_{of2}}{A_3} - V_{of3}$$

As shown in equations 1 and 2, $V_{out}$ does not equal 0 during the offset sampling cycle of this offset correction architecture (the prior art).

When switch SW1 is closed and switch SW2 is opened and the circuit is in normal operation, then the circuit of FIG. 1 can be represented by the following Equation 3:

$$V_{out} = \frac{A_1 A_2 (V_{in} + V_{of1}) - A_2 A_3 (V_{store} + V_{of3}) + A_2 V_{of2}}{1 + \beta A_1 A_2}$$

If it the circuit is designed such that $\beta A_1 A_2 >> 1$, then the circuit of FIG. 1 can be represented by the following Equation 4:

$$V_{out} = \frac{(V_{in} + V_{of1})}{\beta} - \frac{A_3}{\beta A_1}(V_{store} + V_{of3}) + \frac{1}{\beta A_1}(V_{of2})$$

Substituting Equation 2 into Equation 4 yields Equation 5:

$$V_{out} = \frac{(V_{in} + V_{of1})}{\beta} - \frac{(V_{in} + V_{of1})}{\beta} - \frac{(V_{of2})}{\beta A_1} + \frac{1}{\beta A_1}(V_{of2})$$
$$= 0$$

Thus, when A1, A2, and A3>>1, the circuit of FIG. 1 provides theoretically ideal offset correction with no residual DC component. However, this offset cancellation technique causes the outputs of the channel to become corrupted, as shown in equations 1 and 2, during cancellation which can lead to complex timing issues between successive stages that need to correct offsets. This is a significant problem when the offset correction must occur simultaneously across partitioned boundaries in an application.

In sharp contrast to the prior art, the present invention significantly improves upon the analog DC offset correction technique by eliminating the output data corruption that occurs during the above correlated double sampling. The present invention allows DC offset correction to occur independently in several stages by presenting the actual final corrected output offset during correction and sampling, not just after the sampling phase is complete. The present invention has the significant benefit that it greatly simplifies offset pre-charge timing in a multiple-stage offset correction, and allows it to act independently therein.

In the conventional multiple input stage/amplifier configuration of the prior art, the first amplifier is disconnected from its feedback components and then connected to allow offset correction that matches inverting/non-inverting gain differences. In sharp contrast to this, an integrated circuit incorporating the present invention uses a second input stage or second amplifier in parallel with the feedback amplifier that requires correction. The circuit of the present invention connects the second amplifier/input stage in parallel with the first amplifier in its standard feedback configuration.

The second input stage has a much higher transconductance and effective gain and therefore dominates the first amplifier, overdriving the first amplifier—zeroing its outputs. The inputs to the second amplifier are connected to the outputs of the first amplifier, while the outputs of the second amplifier are connected to a storage element, such as a storage capacitor and associated circuitry. This allows the required correction voltage to be stored for use during normal operation.

When the offset storage phase is complete, the inputs to the second amplifier are disconnected from the outputs of the first amplifier, and the voltage stored on the capacitor is used for offset correction. Because the first feedback amplifier configuration is unchanged during correction, its output voltage during correction is identical to its post correction output voltage (ignoring any secondary non-ideal effects that might occur).

Figure 3:
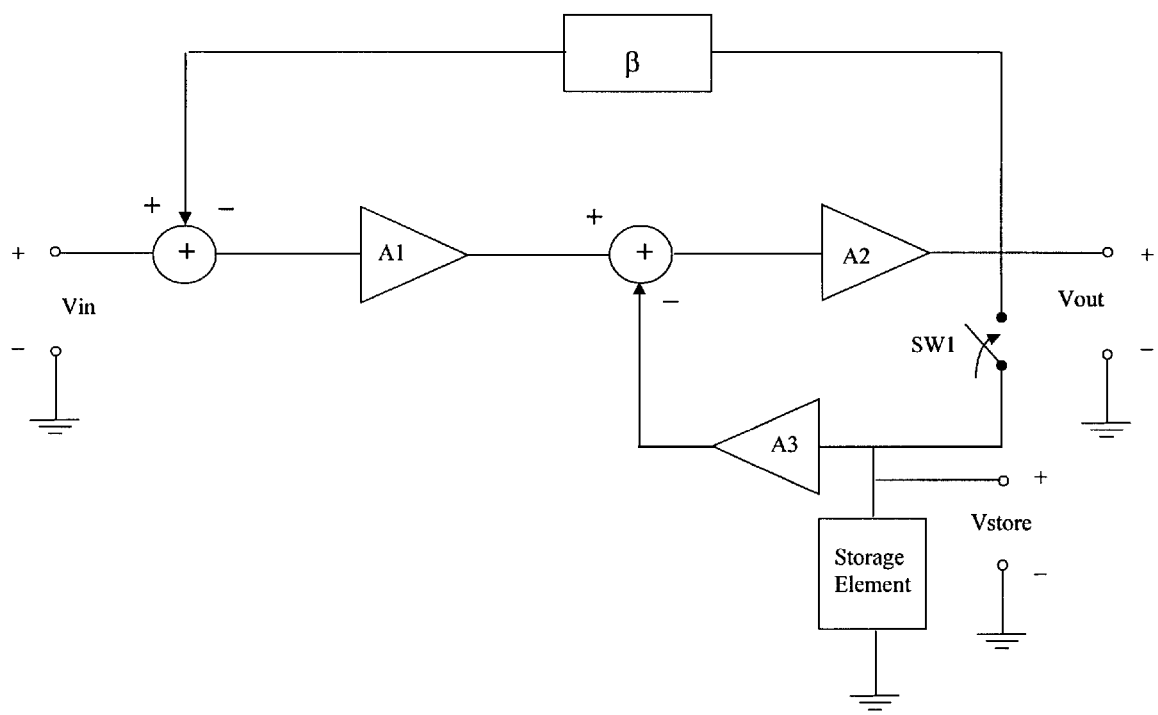
FIG. 3 is a control system diagram of an integrated circuit in a preferred embodiment of the present invention.

A preferred embodiment of an integrated circuit of the present invention is shown in FIG. 3. As shown in FIG. 3, input voltage Vin is applied to the input of amplifier stage A1. The output from amplifier stage A1 is then inputted to amplifier stage A2. The output of amplifier stage A2 is connected across switch SW1 to produce Vstore. Vstore is inputted to inversion stage A3, which is used to add—Vstore to the input to amplifier stage A2. Closed loop gain feedback circuit β provides feedback voltage to the input of amplifier stage A1 in a conventional manner. Note that the amplifier stages A1, A2, and A3 can be integrated into a singular amplifier and need not be individual amplifying stages.

With switch SW1 closed, the circuit of FIG. 3 can be represented by the following Equation 6:

$$V_{out} = V_{store} = \frac{A_1 A_2 (V_{ofin} + V_{of1}) - A_2 A_3 V_{of3} + A_2 V_{of2}}{1 + \beta A_1 A_2 + A_2 A_3}$$

If βA1A2+A2A3>>1, then Equation 6 becomes the Equation 7 below:

$$V_{out} = V_{store} = \frac{A_1 (V_{in} + V_{of1}) - A_3 V_{of3} + V_{of2}}{\beta A_1 + A_3}$$

Thus, when SW1 is opened, the circuit of the present invention remains undisturbed. As a result, unlike with the circuits of the prior art, there is no change in Vout during the transition from offset sampling mode to offset corrected mode/normal circuit operation. This characteristic of the circuit of the present invention provides the significant advantage that multiple stages of offset correction circuits can be cascaded without any complex timing requirements.

In corrected mode (switch SW1 is open and Vstore=Vout) the circuit shown in FIG. 3 can be represented by the following Equation 8:

Equation 8:

$$V_{store} = V_{out} = \frac{A_1 A_2 (V_{in} + V_{of1}) - A_2 A_3 (V_{of3} + V_{store}) + A_2 V_{of2}}{1 + \beta A_1 A_2}$$

If Equation 7 is substituted into Equation 8, then Equation 9 results:

$$V_{out} = \frac{A_1 A_2 (V_{ofin} + V_{of1}) - A_2 A_3 V_{of} + A_2 V_{of2}}{1 + \beta A_1 A_2 + A_2 A_3}$$

Equation 9 matches Equation 6, illustrating that Vout is unchanged when the switch SW1 is opened, switching the circuit from offset store mode to correct mode/normal operation.

Figure 4:
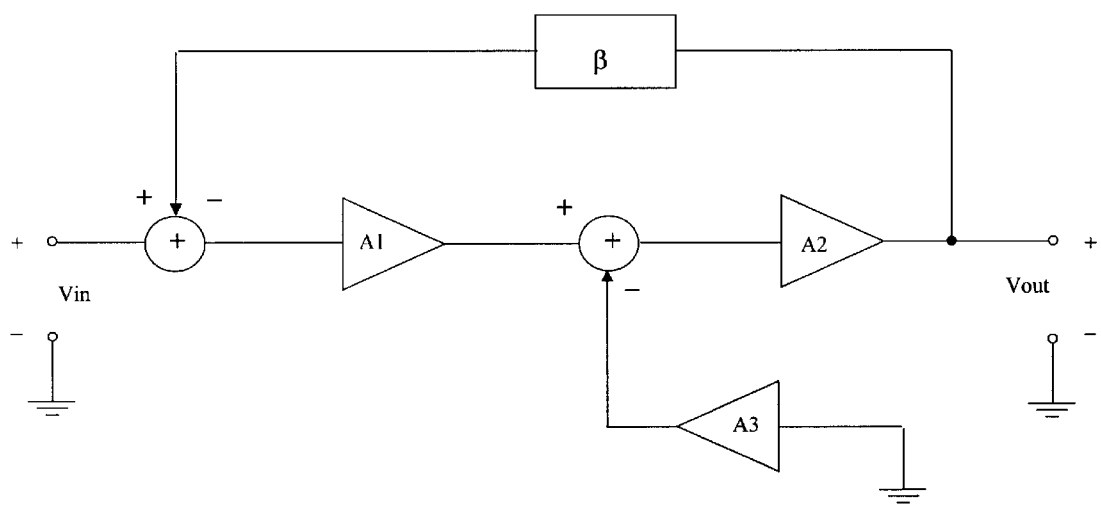
FIG. 4 is a control system diagram of an uncorrected integrated circuit in a preferred embodiment of the present invention.

An illustration of the circuit of FIG. 3 in uncorrected mode is illustrated in FIG. 4. Output voltage Vout can be represented by the Equation 10 below:

$$\text{Equation 10: } V_{out} = \frac{A_1 A_2 (V_{in} + V_{of1}) - A_2 A_3 V_{of3} + A_2 V_{of2}}{1 + \beta A_1 A_2}$$

When βA1A2>>1, Equation 10 becomes Equation 11 below:

$$\text{Equation 11: } V_{out} = \frac{V_{in} + V_{of1} - A_3 V_{of3} + V_{of2}}{A_1 \beta}$$

Taking the ratio of the uncorrected offset voltage of the circuit to the corrected offset voltage (Equation 11/Equation 9) yields the Equation 12:

$$\text{Equation 12: } \frac{\text{Equation 11}}{\text{Equation 9}} = 1 + \frac{A_3}{\beta A_1}$$

Equation 12 illustrates that the ratio of the uncorrected offset voltage to the corrected offset voltage is a function of the gain of amplifier stages A1 and A2, and the amplifier closed loop gain 1/β of the feed back circuit. For practical circuit implementations, it has been found that this offset correction ratio is preferably in the range of about 1.5–4.

The circuit of the present invention can be used in any amplifier stage or amplifier chain that requires DC offset correction to maintain dynamic range and signal integrity. In particular, the invention has valuable applications in portable wireless receiver channels, where multiple offset correction stages in the manner of the present invention can be used to maintain signal integrity, especially at low analog supply voltages. The circuit of the present invention can be used to correct DC offset in many voltages present in the transceiver, such as the input voltage signal received by the receiver circuit in the transceiver, or the voltage signal to be transmitted by the transmitter.

Use of the present invention in the baseband section of a wireless transceiver, would provide significant benefits throughout the world, as more countries adopt new wireless standards. Moreover, the integrated circuit of the present invention could be adopted into any number of wireless receiver products that integrate DC coupled baseband circuits, independent of cellular standard.

While this invention has been described in conjunction with specific embodiments thereof, it is evident that many alternatives, modifications, and variations will be apparent to those skilled in the art. Accordingly, the preferred embodiments of the invention set forth herein are intended to be illustrative, not limiting. Various changes may be made without departing from the spirit and scope of the invention as defined in the appended claims.

I claim:

1. An integrated circuit comprising:
   (a) an amplification circuit having an input and an output, wherein said input is connected to receive an input voltage and to produce an amplified voltage; and
   (b) a sampling circuit connected to said output of said amplification circuit, said sampling circuit being capable of sampling an offset voltage in said amplified voltage during a sampling mode and subtracting a value of said offset voltage from said amplified voltage during a correction mode, and producing an output voltage at an output;
   wherein said output voltage at said output of said sampling circuit is substantially the same during said sampling mode and said correction mode.

2. The integrated circuit of claim 1, further comprising a feedback circuit continuously connected to said output of said sampling circuit and said input of said amplification circuit for adding a feedback voltage to said input voltage based upon said output voltage.

3. The integrated circuit of claim 1, wherein said sampling circuit comprises an additional amplification circuit, a switching circuit, a storage circuit, and an inversion circuit, wherein during said sampling mode, said switching circuit is closed and said storage circuit stores said offset voltage, and during said correction mode, said inversion circuit adds an inverted value of said offset voltage to said amplified voltage.

4. The integrated circuit of claim 3, wherein said additional amplification circuit is an operational amplifier and biasing circuitry.

5. The integrated circuit of claim 3, wherein said inversion circuit is an operational amplifier and biasing circuitry.

6. The integrated circuit of claim 3, wherein said storage circuit is a storage capacitor and biasing circuitry.

7. The integrated circuit of claim 1, further comprising multiple stages of said amplification circuit and said sampling circuit.

8. An transceiver comprising:
   (a) a receiver for receiving an input voltage signal;
   (b) an amplification circuit having an input and an output, wherein said input is connected to receive said input voltage from said receiver and to produce an amplified voltage;
   (c) a sampling circuit connected to said output of said amplification circuit, said sampling circuit being capable of sampling an offset voltage in said amplified voltage during a sampling mode and subtracting a value of said offset voltage from said amplified voltage during a correction mode, and producing an output voltage at an output; and
   (d) a feedback circuit continuously connected to said output of said sampling circuit and said input of said amplification circuit for adding a feedback voltage to said input voltage based upon said output voltage;
   wherein said output voltage at said output of said sampling circuit is substantially the same during said sampling mode and said correction mode.

9. The transceiver of claim 8, further comprising:
   (a) a transmitter for transmitting a voltage signal;
   (b) an amplification circuit having an input and an output, wherein said input is connected to receive said voltage signal from said receiver and to produce an amplified voltage;
   (c) a sampling circuit connected to said output of said amplification circuit, said sampling circuit being capable of sampling an offset voltage in said amplified voltage during a sampling mode and subtracting a value of said offset voltage from said amplified voltage during a correction mode, and producing an output voltage at an output; and
   (d) a feedback circuit continuously connected to said output of said sampling circuit and said input of said amplification circuit for adding a feedback voltage to said input voltage based upon said output voltage;
   wherein said output voltage at said output of said sampling circuit is substantially the same during said sampling mode and said correction mode.

10. The transceiver of claim 8, wherein said transceiver is a wireless transceiver.

11. The transceiver of claim 8, wherein said transceiver is a baseband transceiver.

12. The integrated circuit of claim 8, wherein said sampling circuit comprises an additional amplification circuit, a switching circuit, a storage circuit, and an inversion circuit, wherein during said sampling mode, said switching circuit is closed and said storage circuit stores said offset voltage, and during said correction mode, said inversion circuit adds an inverted value of said offset voltage to said amplified voltage.

13. The integrated circuit of claim 12, wherein said additional amplification circuit is an operation amplifier and biasing circuitry.

14. The integrated circuit of claim 12, wherein said inversion circuit is an operation amplifier and biasing circuitry.

15. The integrated circuit of claim 12, wherein said storage circuit is a storage capacitor and biasing circuitry.

16. The integrated circuit of claim 8, further comprising multiple stages of said amplification circuit and said sampling circuit.

17. A method of correcting a voltage offset in a circuit comprising the steps of:

(a) amplifying an input voltage to produce an amplified voltage;

(b) sampling an offset voltage present in said amplified voltage during a sampling mode;

(c) subtracting a value of said offset voltage from said amplified voltage during a correction mode;

(d) producing an output voltage;

(e) adding a feedback voltage to said input voltage based upon said output voltage; and (f) maintaining said output voltage at substantially the same voltage during said sampling mode and said correction mode.

18. The method of claim 16, wherein said sampling is accomplished by storing said offset voltage during said sampling mode and subtracting said offset voltage from said amplified signal during said correction mode.

* * * * *